(12) United States Patent
Heller

(10) Patent No.: US 11,876,115 B2
(45) Date of Patent: *Jan. 16, 2024

(54) ALIGNMENT-TOLERANT GALLIUM OXIDE DEVICE

(71) Applicant: Government of the United States, as represented by the Secretary of the Air Force, Wright-Patterson AFB, OH (US)

(72) Inventor: Eric Heller, Kettering, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/686,546

(22) Filed: Mar. 4, 2022

(65) Prior Publication Data

US 2022/0190120 A1    Jun. 16, 2022

Related U.S. Application Data

(63) Continuation of application No. 16/561,630, filed on Sep. 5, 2019, now Pat. No. 11,482,600.

(51) Int. Cl.
| | |
|---|---|
| *H01L 29/24* | (2006.01) |
| *H01L 29/66* | (2006.01) |
| *H01L 29/06* | (2006.01) |
| *H01L 29/417* | (2006.01) |
| *H01L 29/423* | (2006.01) |

(52) U.S. Cl.
CPC .......... *H01L 29/24* (2013.01); *H01L 29/0696* (2013.01); *H01L 29/41758* (2013.01); *H01L 29/42356* (2013.01); *H01L 29/66969* (2013.01)

(58) Field of Classification Search
None
See application file for complete search history.

(56) References Cited

U.S. PATENT DOCUMENTS 11,482,600 B1 *  10/2022  Heller .............. H01L 29/41758

OTHER PUBLICATIONS

Dong et al., A Ga2O3 Base Metal with Good Heat Heat Dispersion Performance Oxide Semiconductor Field Effect Transistor and its Preparation Method, Jul. 4, 2017 (Year: 2017).*

* cited by examiner

*Primary Examiner* — Alexander G Ghyka
(74) *Attorney, Agent, or Firm* — AFMCLO/JAZ; Chastity D. S. Whitaker

(57) ABSTRACT

A gallium oxide field effect transistor that is built on a base layer. A doped gallium oxide channel layer is disposed on top of the base layer, and a dielectric barrier layer is disposed on top of the gallium oxide channel layer. Source contacts and drain contacts are disposed on top of the dielectric barrier layer, with one each of the drain contacts disposed in an interdigitated manner between one each of the source contacts. The interdigitated source contacts and drain contacts thereby define channels between them, where alternating ones of the channels are defined as odd channels, with even channels disposed therebetween. Gate contacts are disposed on top of the dielectric barrier layer in only one of the odd channels and the even channels.

6 Claims, 4 Drawing Sheets

300

ALIGNMENT-TOLERANT GALLIUM OXIDE DEVICE

This application is a continuation application of U.S. application Ser. No. 16/561,630 filed on Sep. 5, 2019, the disclosure of which is incorporated herein by reference in its entirety.

GOVERNMENT RIGHTS STATEMENT

The invention described herein may be manufactured and used by or for the Government of the United States for all governmental purposes without the payment of any royalty.

FIELD OF THE INVENTION

This invention relates to the field of integrated circuits. More particularly, this invention relates to an alignment fault-tolerant field effect transistor.

BACKGROUND OF THE INVENTION

Field effect transistors (FETs) are well-adapted for power switching operations. FIG. 1 depicts a top plan view of a very simplistic prior art FET 100 for such an application. One aspect that makes FETs useful for power switching is that they can be scaled to have many current-carrying pathways that can divide and reduce the amount of current that passes through each individual pathway, thus enabling the FET 100 to conduct a large amount of current.

For example, FET 100 has a plurality of sources 102 on which there is a voltage potential. When a voltage is applied to a gate 104, current can flow through the channel layer 106 underneath the gate 104 and out through a drain 108. As used herein, the term "gate" refers to the portion of the FET 100 that is gating the current flow, which can be more complex than that as depicted in the figures, and can include structures such as the gate footprint, one or more gate field plates, one or more source-connected field plates, gate recess, self-aligned processes, and so forth.

By having gates 104 between each interleaving finger of the sources 102 and the drains 108, the total current is divided through a plurality of channels 106, and thus each individual channel 106 can be designed and fabricated to conduct something that is less than the entire amount of current to be switched. In practical terms, this means that the FET can be smaller in some dimensions, which means more circuits per unit area, which is a general design goal for all integrated circuits.

With reference now to FIG. 2A, there is cross-sectional side view of a portion of the prior art FET 100, depicting the basic elements of the simplified FET 100, such as some of the sources 102, gates 104, channel layer 106, drains 108, dielectric layer 110, and base layer 112. In practice, sources 102 and drains 108 must make good electrical contact with channel layer 106 by use of some type of additional processing, such as etching away the dielectric layer 110 or altering it in some manner to make it electrically conductive under the sources 102 and drains 108. For simplicity, that processing is not shown in the drawings.

As depicted in FIG. 2A, it is desirable to maintain even spacing of the gates 104 between the sources 102 (114$a$-$s$) and the drains 108 (114$a$-$d$), such that every source 102 to gate 104 spacing 114$a$-$s$ is the same as every other source 102 to gate 104 spacing and likewise every drain 108 to gate 104 spacing 114$a$-$d$ is the same as every other drain 108 to gate 104 spacing. The source 102 to gate 104 spacing 114$a$-$s$ may equal the drain 108 to gate 104 spacing 114$a$-$d$ but is generally less.

Any processing misalignment that causes the gates 104 to shift in one direction or the other relative to sources 102 and drains 108 causes some of the gates 104 to be shifted closer to some of the sources 102, and some of the gates 104 to be shifted closer to some of the drains 108, as depicted in FIG. 2B. As depicted, the gates 104 have been shifted left, making some of the spacings 114$b$-$s$ and 114$b$-$d$ relatively shorter and others of the spacings 114$c$-$s$ and 114$c$-$d$ relatively longer.

FIG. 2A illustrates the point in the simplest possible way, but the problem illustrated is more general. As mentioned before where the term "gate" was introduced, gate 104 will typically contain multiple structures and this general processing misalignment problem as described will manifest in a similar fashion. This is important because the gate 104 layers are often the smallest and least misalignment tolerant layers in the FET 100.

For example, if there are two gate 104 layers "gate footprint" and "gate field plate," a misalignment of the gate footprint relative to the gate field plate will cause some of the gate 104 layers to behave electrically very differently than others. Specifically, for power switching the drain 108 must be able to hold off a high voltage with huge electric fields that must be managed, such as through the precise alignment of the layers that comprise the gate 104. In the prior art FIG. 2A, it can be seen that this relative misalignment within gate 104 will cause different electrical behavior if the drain 108 is to the left than if it is to the right.

When this occurs, the channel layer 106 that is beneath a gate 104 that is closer to a source 102 (spacings 114$b$-$s$) will start conducting current (turn on) either sooner or later than the channel layer 106 that is beneath a gate 104 that is farther from a source 102 (spacings 114$c$-$s$) as the overall gate 104 voltage is changed to turn the entire device on. Whether it turns on sooner or later depends on the overall contributions of all the misalignments. Regardless, the channel layers 106 that start conducting current first will tend to receive more current than they are designed to carry, and will tend to heat up, forming so-called hot spots, which tend to degrade and sometimes destroy the FET 100, or even other portions of the integrated circuit in which the FET 100 is disposed. Regardless of the direction of misalignment in this design for a FET 100, some of the source 102 and gate 104 spacings 114 will be relatively shorter, and others of the source 102 and gate 104 spacings 114 will be relatively longer.

For this reason, it is very important to ensure proper alignment of the various structures of the FET 100. However, as circuit geometries are continually reduced, even smaller and smaller misalignment errors can result in problems such as those described above. For example, gallium oxide devices have such small geometries that it tends to be extremely difficult to properly align the structures, even when great care is taken to do so.

What is needed, therefore, is a structural design for a FET that tends to reduce issues such as those described above, at least in part.

SUMMARY OF THE INVENTION

The above and other needs are met by a gallium oxide field effect transistor that is built on a base layer that may also be gallium oxide, or may be other materials. High quality gallium oxide may be deposited on bulk gallium oxide, select other materials with desirable properties (e. g.

lattice properties for good crystal growth), or may be placed on a suitable base layer after growth such as by a wafer bonding process. A doped gallium oxide channel layer is disposed on top of the base layer, and a dielectric barrier layer is disposed on top of the gallium oxide channel layer. Source contacts and drain contacts are disposed on top of the dielectric barrier layer, with one each of the drain contacts disposed in an interdigitated manner between one each of the source contacts. The interdigitated source contacts and drain contacts thereby define channels between them, where alternating ones of the channels are defined as odd channels, with even channels disposed therebetween. Gate contacts are disposed on top of the dielectric barrier layer in only one of the odd channels and the even channels.

Thus, any misalignment affects all of the source drain pairs in the same way, by either lengthening the key distances or shortening the key distances, but not both. For a typical FET with a gate field plate and a gate footprint, there are three key distances: drain to gate field plate, drain to gate footprint, and gate field plate to gate footprint. For a device with multiple field plates, there will be more key distances.

In various embodiments according to this aspect of the invention, the base layer has a thickness of between about 1,000 angstroms and about one millimeter. In some embodiments, the doped gallium oxide channel layer has a thickness of between about ten angstroms and about 2,000 angstroms. In some embodiments, the dielectric barrier layer has a thickness of between about ten angstroms and about 500 angstroms. In some embodiments, the channels have a length of between about 500 nanometers and about 10,000 nanometers. In some embodiments, the doped gallium oxide channel layer is n-doped.

According to another aspect of the invention there is described an electronic circuit including a gallium oxide field effect transistor. The gallium oxide field effect transistor has a base layer, a doped gallium oxide channel layer on top of the base layer, a dielectric barrier layer on top of the channel layer, and source and drain contacts on top of the dielectric barrier layer. One each of the drain contacts is disposed in an interdigitated manner between one each of the source contacts, thereby defining channels between the drain contacts and the source contacts. Alternating ones of the channels are defined as odd channels and even channels, and gate contacts are disposed on top of the barrier layer in only one of the odd channels and the even channels.

In various embodiments according to this aspect of the invention, the base layer has a thickness of between about 1,000 angstroms and about one millimeter. In some embodiments, the doped gallium oxide channel layer has a thickness of between about ten angstroms and about 2,000 angstroms. In some embodiments, the dielectric barrier layer has a thickness of between about ten angstroms and about 500 angstroms. In some embodiments, the channels have a length of between about 500 nanometers and about 10,000 nanometers. In some embodiments, the doped gallium oxide channel layer is n-doped.

According to yet another aspect of the invention there is described a method for fabricating a gallium oxide field effect transistor. A base layer is formed, with a doped gallium oxide channel layer disposed on top of the gallium oxide base layer. A dielectric barrier layer is disposed on top of the gallium oxide channel layer, and source contacts and drain contacts are disposed on top of the dielectric barrier layer, with one each of the drain contacts disposed in an interdigitated manner between one each of the source contacts. The interdigitated source contacts and drain contacts thereby define channels between them, where alternating ones of the channels are defined as odd channels and even channels. Gate contacts are disposed on top of the dielectric barrier layer in only one of the odd channels and the even channels.

In various embodiments according to this aspect of the invention, the steps of forming the source contacts, drain contacts, and gate contacts are accomplished at least in part by at least one of electron beam lithography and optical lithography. In some embodiments, the steps of forming the source contacts, drain contacts, and gate contacts are accomplished at least in part by at least one of evaporation and sputtering. In some embodiments, the step of forming the doped gallium oxide channel layer is accomplished at least in part by ion implantation. In some embodiments, the step of forming the dielectric barrier layer is accomplished at least in part by at least one of HVPE, MO-CVD, CVD, and mist-CVD. In some embodiments, the base layer is formed with a thickness of between about 1,000 angstroms and about one millimeter. In some embodiments, the base layer is electrically insulating gallium oxide.

The method of claim 13, wherein the doped gallium oxide channel layer is formed with a thickness of between about ten angstroms and about 2,000 angstroms. In some embodiments, the dielectric barrier layer is formed with a thickness of between about ten angstroms and about 500 angstroms.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION OF THE INVENTION

Figure 1:
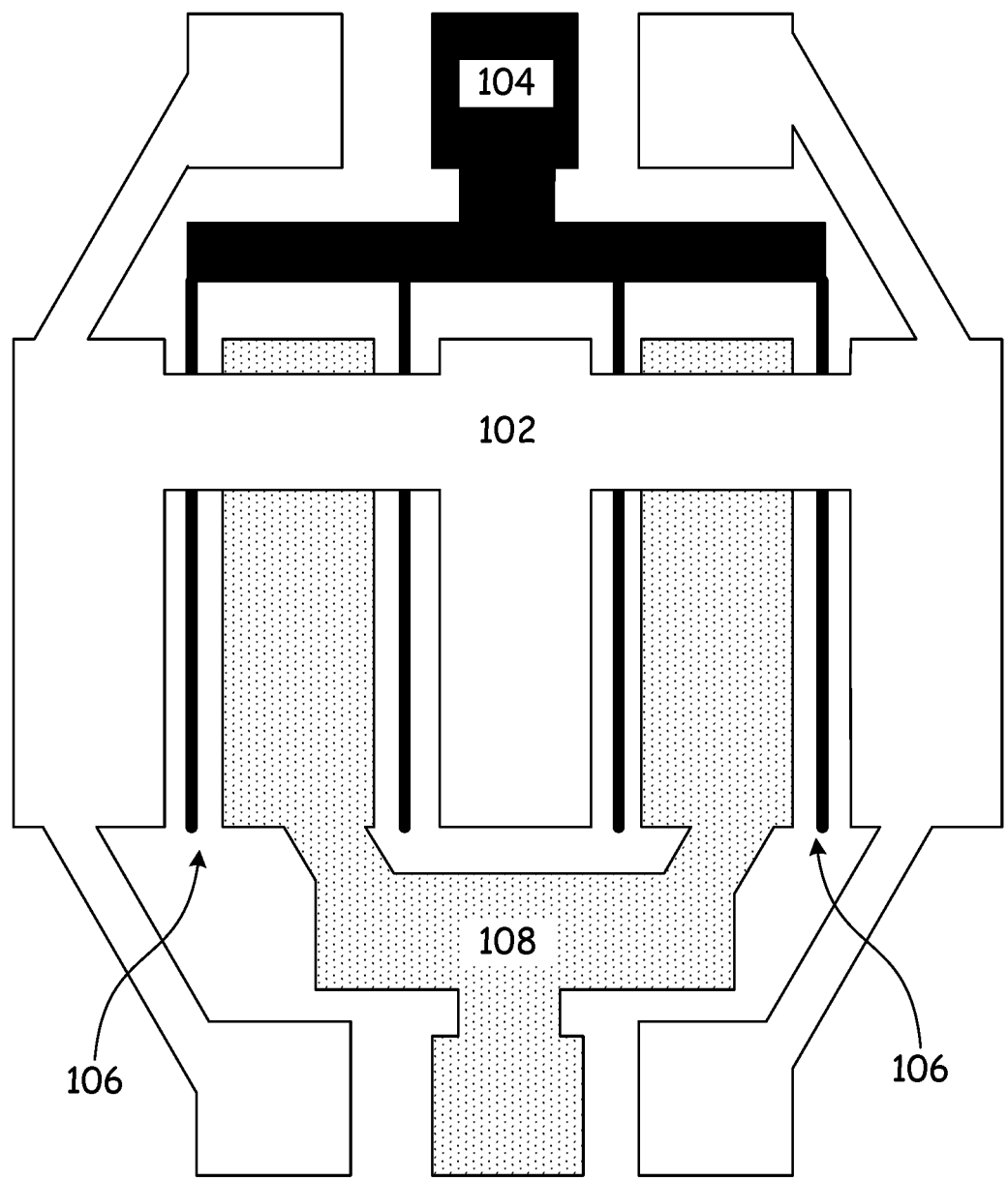
FIG. 1 depicts a simplified top plan view of a prior art design of a field effect transistor, for comparison purposes.
Figure 2A:
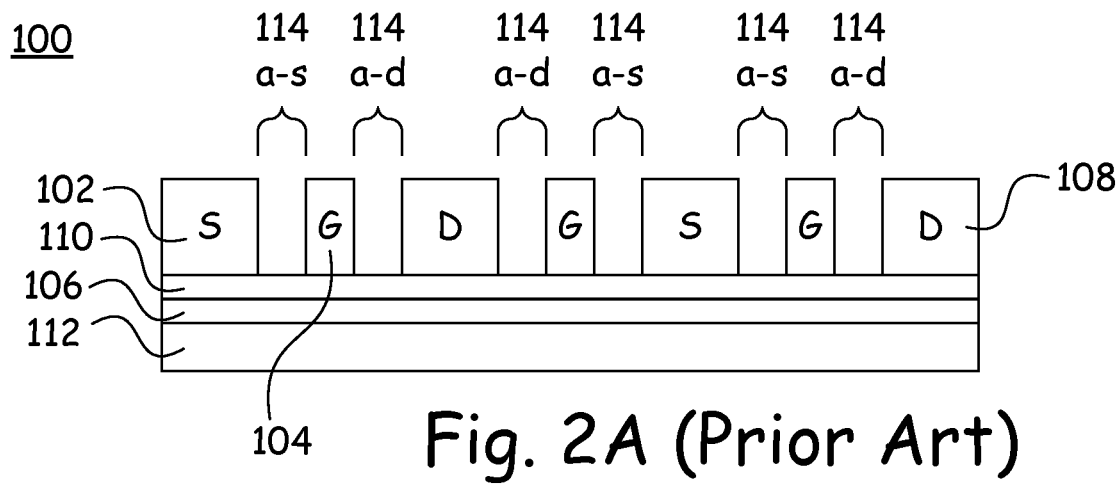
FIG. 2A depicts a simplified cross-sectional view of a properly aligned prior art design of field effect transistor.
Figure 2B:
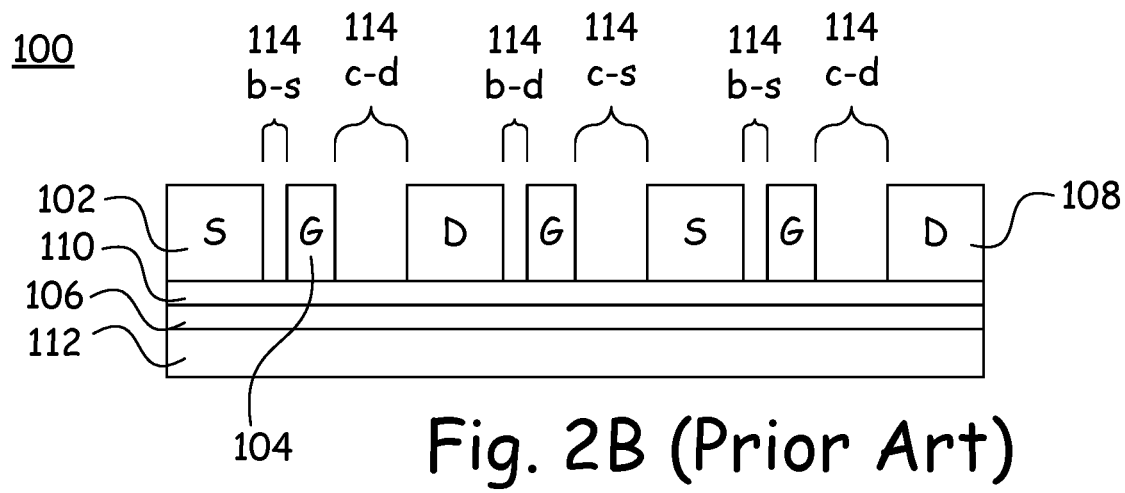
FIG. 2B depicts a simplified cross-sectional view of an improperly aligned prior art design of field effect transistor.
Figure 3:
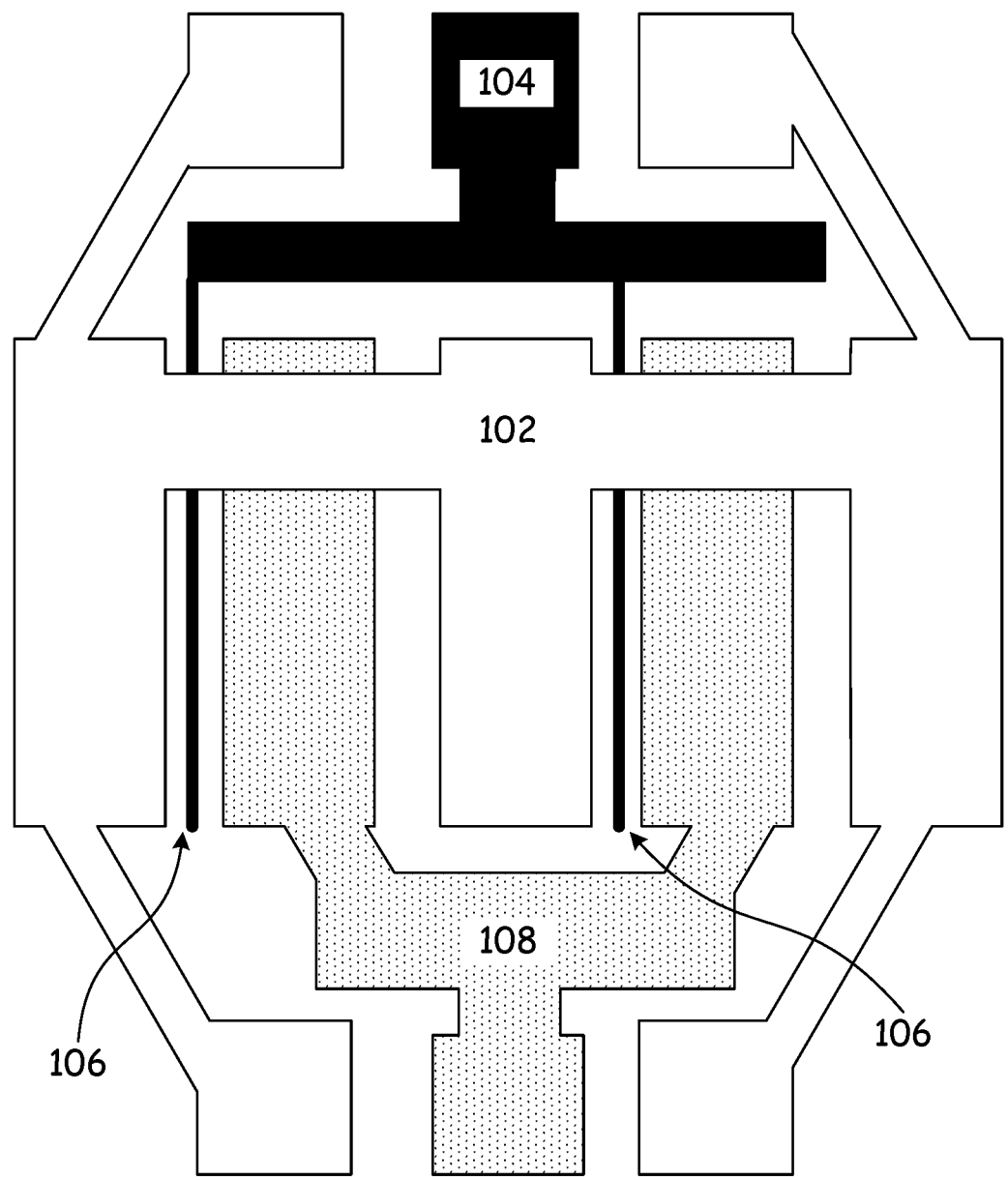
FIG. 3 depicts a simplified top plan view of a field effect transistor according to an embodiment of the present invention.

With reference now to FIG. 3, there is depicted a FET 300 that has been modified according an embodiment of the present invention. In the embodiment depicted, the modification is to remove the gates 104 that were disposed such that the drains 108 were on the left of the gate 104 and the sources 102 were on the right of the gate 104. What remains is a FET 300 where the gates 104 are only disposed such that the sources 102 are on the immediate left of the gate 104 and the drains 108 are only on the immediate right of the gate 104.

It is appreciated that in other embodiments the removal of such gates 104 will allow further modification to the FET 300, such as the removal of the source 102 on the far right of FIG. 3. However, no such other modifications are shown in FIG. 3, so that the difference in the placement of the gates 104 can be more readily identified. It is also appreciated that the gates 104 could have been removed such that the sources 102 are on the immediate right of the gate 104 and the drains 108 are only on the immediate left of the gate 104.

Figure 4A:
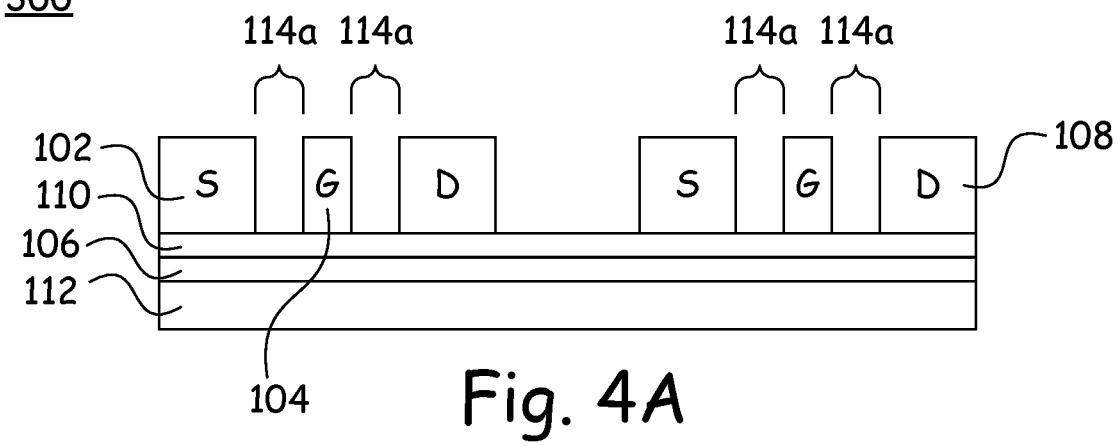
FIG. 4A depicts a simplified cross-sectional view of a properly aligned field effect transistor according to an embodiment of the present invention.

With reference now to FIG. 4A, there is depicted a FET 300 according to an embodiment of the present invention, where the gates 104 have been properly aligned. As with the prior art FET 100, the spacing 114a between the gates 104 and the sources 102 and between the gates 104 and the drains 108 is substantially equal. In such a case, none of the channels 106 disposed underneath the gates 104 will turn on any earlier than any of the other channels 106.

Figure 4B:
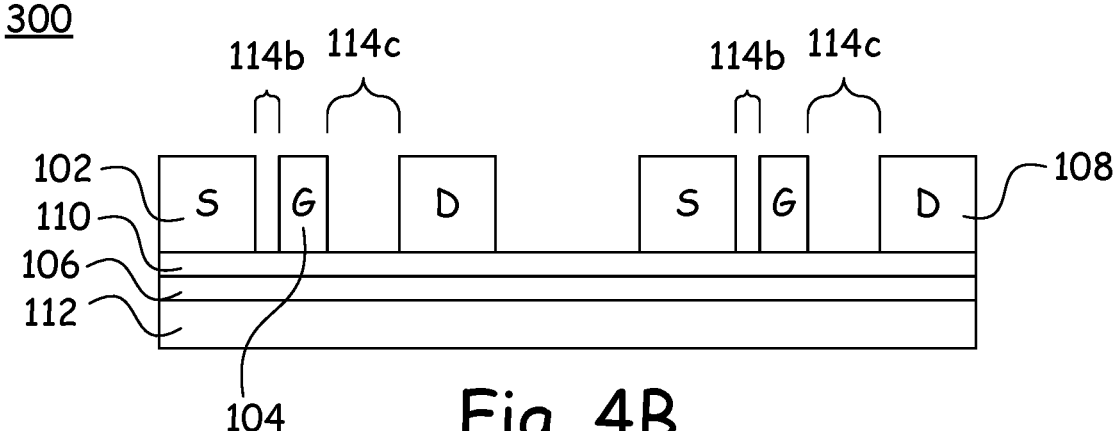
FIG. 4B depicts a simplified cross-sectional view of an improperly aligned field effect transistor according to an embodiment of the present invention.

However, as depicted in FIG. 4B, there is some misalignment of the gates 104 relative to the sources 102 and the drains 108. In this particular embodiment, the gates 104 have been misaligned such that the length 114b between the sources 102 and the gates 104 is shorter than the length 114c between the drains 108 and the gates 104. Notice, however, that the length 114b to the gates 104 is the same for all of the sources 102. This would be true regardless of the direction of misalignment of the gates 104—or in other words, regardless of whether the misalignment created an increase 114c or a decrease 114b in the length between the gate 104 and the source 102. Thus, none of the channels 106 will turn on any earlier than any of the other channels 106, and no hot spots will form.

As introduced above, while various embodiments of this invention can be applied to any FET technology, it is especially applicable to those technologies that have very small dimensions. For example, at the present time, gallium oxide technology has small dimensions, and so gallium oxide would be a good candidate for the application of various embodiments of the present invention. As future technologies evolve with even smaller technologies, various embodiments of the present invention will have increasing applicability and utility.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

REFERENCE NUMBER INDEX

100 Prior art field effect transistor
102 Source
104 Gate
106 Channel layer
108 Drain
110 Dielectric layer
112 Base layer
114 Gap
300 New embodiment of field effect transistor

What is claimed is:

1. An electronic circuit including a gallium oxide power field effect transistor (FET), the gallium oxide field effect transistor comprising:
   a base layer;
   a doped gallium oxide channel layer disposed on top of the base layer;
   a dielectric barrier layer disposed on top of the gallium oxide channel layer, wherein a portion of the dielectric layer is altered for providing a source contact or a drain contact;
   the source contacts disposed on top of the altered dielectric barrier layer;
   the drain contacts disposed on top of the altered dielectric barrier layer, with one each of the drain contacts disposed in an interdigitated manner between adjacent ones of the source contacts such that channels are defined as odd channels and with even channels disposed therebetween; and
   gate contacts disposed on top of the dielectric barrier layer in of the odd channels or the even channels while the even channels or the odd channels without gate contacts are electrically insulated,
   wherein misalignment of the gate contacts in the odd channels between source contacts and the drain contacts causes odd channels to turn on at a rate and voltage that differs from a turn on rate and voltage resulting from misalignment of the gate contacts in the event channels between drain contacts and source contacts and wherein having removing the gate contacts from the odd channels or the even channels provides uniform turn on rate and voltage.

2. The electronic circuit of claim 1, wherein the base layer has a thickness of between about 1,000 angstroms and about 1 millimeter.

3. The electronic circuit of claim 1, wherein the doped gallium oxide channel layer has a thickness of between about 10 angstroms and about 2,000 angstroms.

4. The electronic circuit of claim 1, wherein the dielectric barrier layer has a thickness of between about 10 angstroms and about 500 angstroms.

5. The electronic circuit of claim 1, wherein the channels have a length of between about 500 nanometers and about 10,000 nanometers.

6. The electronic circuit of claim 1, wherein the doped gallium oxide channel layer is n-doped.

* * * * *